United States Patent
Buchenrieder et al.

Patent Number: 5,706,225
Date of Patent: Jan. 6, 1998

[54] MEMORY APPARATUS WITH DYNAMIC MEMORY CELLS HAVING DIFFERENT CAPACITOR VALUES

[75] Inventors: Klaus Buchenrieder, Riemerling; Michael Kaelbling, Munich, both of Germany

[73] Assignee: Siemens Aktiengesellschaft, Munich, Germany

[21] Appl. No.: 652,915

[22] Filed: May 20, 1996

[30] Foreign Application Priority Data

May 18, 1995 [DE] Germany .............. 195 18 348.7

[51] Int. Cl.$^6$ ............................. G11C 17/04
[52] U.S. Cl. .............. 365/102; 365/149; 365/222
[58] Field of Search .............. 365/102, 149, 365/222

[56] References Cited

U.S. PATENT DOCUMENTS

| | | | |
|---|---|---|---|
| 3,654,499 | 4/1972 | Smith | 365/102 |
| 5,020,025 | 5/1991 | Nix et al. | 365/102 |
| 5,341,326 | 8/1994 | Takase et al. | 365/102 |
| 5,406,507 | 4/1995 | Knierim et al. | 365/102 |
| 5,406,511 | 4/1995 | Nogami | 365/102 |
| 5,418,739 | 5/1995 | Takasugi | 365/102 |
| 5,544,096 | 8/1996 | Takasugi | 365/102 |

*Primary Examiner*—Joseph E. Clawson, Jr.
*Attorney, Agent, or Firm*—Hill, Steadman & Simpson

[57] ABSTRACT

A memory apparatus with dynamic memory cells that can be used both as a read-only memory and also as a volatile memory is provided. The memory apparatus has a capacitance value allocated to the capacitors present in the memory cells; the value is required for operation as a read-only memory. For read-only memory operation, memory cells are provided whose capacitors have different capacitance values corresponding to the type of information to be stored. A method of operating a memory apparatus is also provided. In the method, the information can be set by first charging all the memory cells and then applying a refresh signal to the memory cells with such a clock rate that the memory cells with the larger capacitance value do not discharge, but the memory cells with the smaller capacitance value discharge. In operation as a volatile memory, a refresh signal is applied to the memory cells in the standard way.

6 Claims, 1 Drawing Sheet

MEMORY APPARATUS WITH DYNAMIC MEMORY CELLS HAVING DIFFERENT CAPACITOR VALUES

BACKGROUND OF THE INVENTION

1. Field of the Invention

The present invention relates generally to memories and more specifically to a memory apparatus with dynamic memory cells having different capacitor values.

2. Description of the Related Art

Integrated electronic information memories are offered either as volatile, i.e. dynamically reprogrammable memories, or as non-volatile road-only memories. Dynamic random-access memories (DRAM) must be periodically refreshed, or they lose the stored information. The read-only memories, on the other hand, cannot be modified after they have been manufactured. In the read-only memory, the information is thus permanently available.

A combination of volatile and non-volatile memories would be advantageous if both types of memory are required in one device. The combination of the two memory types is known, but the memory cells in the two memory types are different.

The problem underlying the invention is the combination of volatile and non-volatile, i.e. read-only memories, Dynamic memory cells are to be used, which are usable both as memory cells for the volatile memory and for non-volatile read-only memories.

A need has arisen for a memory apparatus with dynamic memory cells having different capacitor values to provide both volatile and nonvolatile memory.

SUMMARY OF THE INVENTION

To this end, the present invention provides a memory apparatus with dynamic memory cells, that can be used both in a first operating mode as a read-only memory and also in a second operating mode as a volatile memory. Each memory cell has a capacitor that stores information and whose capacitance value is dimensioned in a manner corresponding to the information to be stored, in a read-only manner. Also, a refresh signal is supplied to the memory cells at a clock rate dependent on the mode of operation.

It is essential that the size of the capacitive charge storage of the dynamic memory cells be dimensioned in a manner corresponding to the information to be stored in a read-only manner.

If the memory is operating as a volatile memory, then a refresh signal having a high clock rate is applied to the memory cells, and the capacitor of each memory cell is fully charged, independent of its size. In this mode of operation, there is thus no difference from standard dynamic memories.

If the memory is also to be used as a read-only memory, then it is useful to use memory cells having different capacitors. For example, two types of memory cells can be used, first memory cells having a first capacitor value and second memory cells having a second capacitor value. For the impressing of the information "1" or "0" into the read-only memory, first all capacitors of the memory cells are charged, and a refresh signal is subsequently applied, having a clock rate such that the capacitors of the memory cells having a small capacitor value discharge, but the memory cells having large capacitor values do not discharge. The memory cells having large capacitor values then store the information of the one type, e.g. "1," and the memory cells having small capacitor value store the information of the other type, e.g. "0."

Of course, it is possible to use other types of memory cells having other capacitor values, so that several information values can be impressed.

The invention is further explained with reference to an exemplary embodiment as illustrated in figures.

DETAILED DESCRIPTION OF THE PREFERRED EMBODIMENTS

Figure 1:
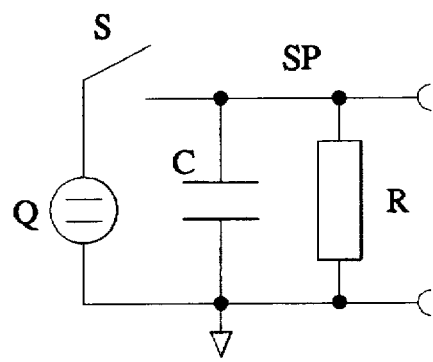
FIG. 1 is a schematic diagram of an embodiment of a memory cell manufactured in accordance with the principles of the present invention.
Figure 2:
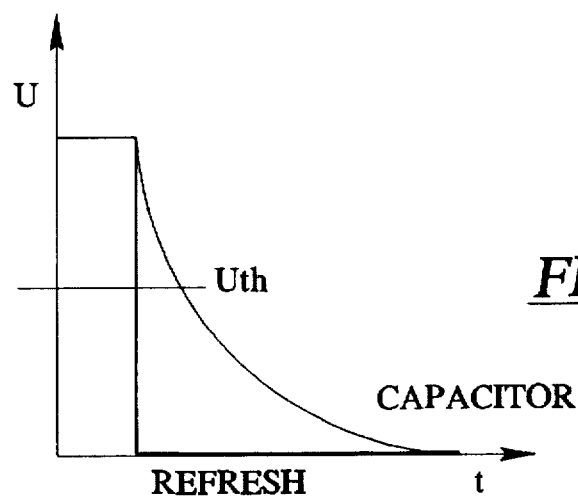
FIG. 2 is a diagram of the discharge characteristic of a capacitor.

A schematic diagram of a memory cell SP according to FIG. 1 shows a capacitor C, a resistor R, a switch S and a current source Q. The capacitor C can be charged via the switch S. If the switch S is opened, the capacitor C discharges via the resistor R according to the characteristic shown in FIG. 2. Here voltage U is plotted over time t. Furthermore, the refresh signal is represented by a vertical bold line. It can be seen that, after the refresh signal by means of which the capacitor C has been charged, the discharging of the capacitor takes place in a known manner. If the voltage of the capacitor lies below a predetermined threshold voltage Uth, the information stored in the capacitor C changes.

For example, the presence of a voltage lying above the threshold voltage can be regarded as a logical "1," and the absence of a voltage at the capacitor can be a logical "0." For cases in which no unambiguous voltage can be allocated to the "1" or to the "0," a logical value "X" can be allocated.

If the memory consists of memory cells in which only two different types of capacitors are present, i.e. memory cells with a capacitor C1 and memory cells with a capacitor C2, then the size or the value of the capacitor C1 can be chosen so that it loses its information if the clock rate f1 of a refresh signal is too small. The capacitor C2, whose value can be chosen to be larger than the value of the capacitor C1, is operated at a clock rate f2. The capacitor C2 loses its information if the clock rate f2 is too slow. If f2 is sufficiently larger than f1, a "1" is written in C1, and if the memory cell with C1 is refreshed with the clock rate f2, a "0" is read here later. If at the same time a "1" has been written in a memory cell with C2 and it is refreshed with the clock rate f2, then a "1" is still read from memory cells with C2. Of course, values of "0" stored in both memory cells are always read as "0".

In the mode of operation as a volatile memory (RAM), all cells are refreshed with the clock rate f1. That is, in the RAM mode of operation the memory behaves as a typical DRAM.

In the mode of operation as a read-only memory, the information stored in the memory cells is determined by the manufacturing. In this mode of operation, all memory cells are first written with a "1," i.e. all memory cells are charged. Refreshing subsequently takes place with the clock rate f2. This has the result that the memory cells with C1 discharge and a "0" is thus stored there, while the memory cells with C2 remain charged, and a "1" is thus stored there. In the following, the read-only memory must be refreshed only with the clock rate f2.

The two clock rates f1 and f2 may present two different clock impulses or may be obtained from a single clock impulse.

A memory can also be constructed so that it comprises memory cells with more than two different capacitor values, in the general case with n different capacitor values. The memory thereby contains memory cells that must be refreshed with different clock rates fn, where n is a whole number. A memory of this sort can be refreshed with the clock rate f1 in the RAM operating mode. In the ROM operating mode, again, the memory cells are first all charged and then refreshed with a clock rate chosen so that the desired part of the memory cells can discharge, while the rest cannot.

Figure 3:
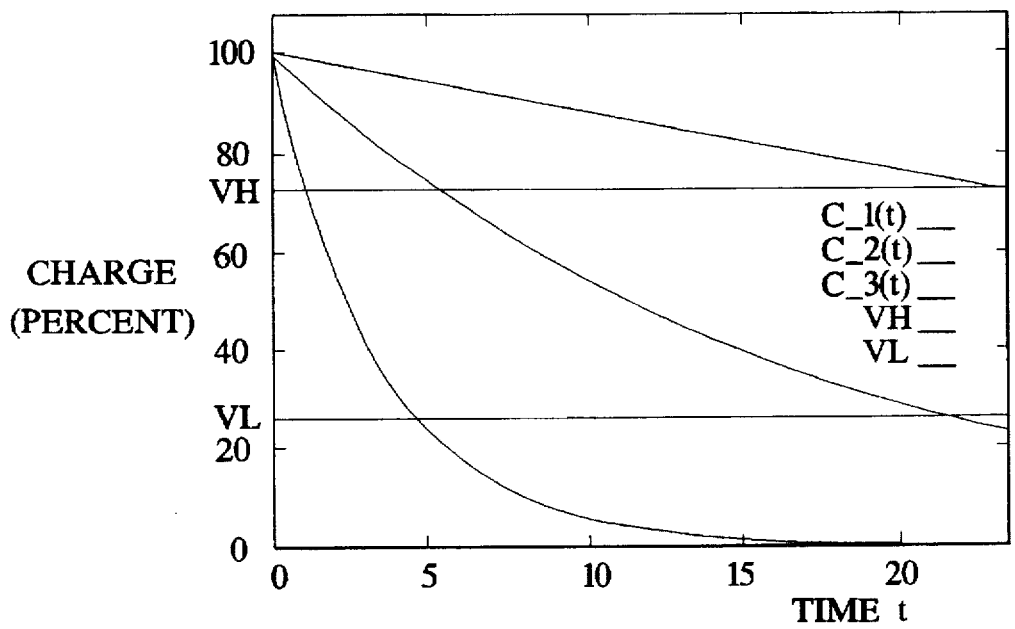
FIG. 3 is a diagram of various discharge characteristics of different capacitors plotted as a charge percentage over time, t.

It is also possible to allocate different information to the memory cells having different capacitor values. These different information values are achieved during the application of refresh signals at one clock rate; the individual capacitors have a different charge, and the signals are evaluated. These relationships are shown in FIG. 3, for example. Here three capacitors C1–C3 of different values are shown with their discharge characteristics. The capacitor C1 has the smallest capacitance value, and the capacitor C3 has the largest value. Two thresholds VH and VL are shown. If a capacitor has a value lying above VH, it can be allocated to a "1", while if it has a value lying below VL it can be allocated to a "0," and to an "X" if it has a value lying between VL and VH. If further capacitors having other capacitance values are used, still more types of information can be stored.

Although modifications and changes may be suggested by those skilled in the art, it is the intention of the inventors to embody within the patent warranted hereon all changes and modifications as reasonably and properly come within the scope of their contribution to the art.

We claim as our Invention:

1. A memory apparatus with dynamic memory cells usable in both a first operating mode as a read-only memory and in a second operating mode as a volatile memory, the memory apparatus comprising:

a plurality of said memory cells wherein each memory cell has a capacitor that stores information, and the capacitor has a capacitance value dimensioned in a manner corresponding to the information to be stored in a read-only manner; and means for supplying a refresh signal to the memory cells at a clock rate dependent on the operating mode.

2. The memory apparatus according to claim 1, wherein said plurality of memory cells comprise groups of memory cells with different capacitor values.

3. The memory apparatus according to claim 1, wherein said plurality of memory cells further comprises:

a first memory cell having a first capacitor with a first capacitance value; and a second memory cell having a second capacitor with a relatively larger capacitance value compared to the first capacitance value.

4. The memory apparatus of claim 1, wherein said plurality of memory cells further comprises:

a plurality of capacitors having a plurality of capacitance values.

5. A method of operating a memory apparatus having dynamic memory cells usable in both a first operating mode as a read-only memory and in a second operating mode as a volatile memory, the method comprising the steps of:

charging said memory cells in a read-only memory operation;

providing said memory cells with capacitors having capacitance values; and applying a refresh signal to said memory cells, wherein the refresh signal has a clock rate such that the memory cells with capacitors having a smaller capacitance value discharge, and the memory cells with capacitors having a larger capacitance value do not discharge.

6. The method of claim 5 wherein the step of applying a refresh signal further comprises:

selecting a clock rate so that a selected part of said plurality of memory cells can discharge, while a remaining part of said plurality of memory cells cannot discharge.

* * * * *